(12) United States Patent
Li et al.

(10) Patent No.: US 7,345,530 B1
(45) Date of Patent: Mar. 18, 2008

(54) REGULATED SWITCH DRIVING SCHEME IN SWITCHED-CAPACITOR AMPLIFIERS WITH OPAMP-SHARING

(75) Inventors: Jipeng Li, Nashua, NH (US); Matthew Courcy, Fremont, NH (US); Gabriele Manganaro, Boxborough, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 79 days.

(21) Appl. No.: 11/421,716

(22) Filed: Jun. 1, 2006

(51) Int. Cl.
*H03F 1/02* (2006.01)

(52) U.S. Cl. .......................................... 330/9; 330/51
(58) Field of Classification Search ................ 330/9, 330/51, 107; 327/124, 307
See application file for complete search history.

(56) References Cited

U.S. PATENT DOCUMENTS

| | | | | |
|---|---|---|---|---|
| 5,739,720 A | * | 4/1998 | Lee | 330/9 |
| 6,768,374 B1 | * | 7/2004 | Lee | 330/9 |
| 7,250,813 B1 | * | 7/2007 | Yao | 330/9 |

OTHER PUBLICATIONS

D. Johns et al., "Analog Integrated Circuit Design," John Wiley & Sons, Inc., 1997, pp. 397-398.

K. Nagaraj et al., "A 250-mW, 8-b, 52-Msamples/s Parallel-Pipelined A/D Converter with Reduced Number of Amplifiers," IEEE J. Solid State Circuits, vol. 32, No. 3, pp. 312-320, Mar. 1997.

B. Min et al., "A 69-mW 10-bit 80-MSample/s Pipelined CMOS ADC," IEEE J. Solid State Circuits, vol. 38, No. 12, pp. 2031-2039, Dec. 2003.

M. Dessouky et al., "Very Low-Voltage Digital-Audio ΔΣ Modulator with 88-dB Dynamic Range Using Local Switch Bootstrapping," IEEE J. Solid State Circuits, vol. 36, pp. 349-355, Mar. 2001.

* cited by examiner

*Primary Examiner*—Henry Choe
(74) *Attorney, Agent, or Firm*—Carmen C. Cook; Patent Law Group LLP

(57) ABSTRACT

A switched-capacitor amplifier circuit including first and second pairs of sampling capacitors for sampling a pair of input signals includes a voltage regulator coupled to receive a first reference voltage and generate a first regulated output voltage related to the first reference voltage and independent of a first power supply voltage; a clock signal generator generating first and second clock signals referenced to the first power supply voltage and third and fourth clock signals referenced to the first regulated output voltage; and a first set of switches coupling the bottom plates of the sampling capacitors to the amplifier, the first set of switches being controlled by the third and fourth clock signals. The circuit may further include a second set of switches coupling the top plates of the sampling capacitors to the input signals, the second set of switches being controlled by the first and second clock signals.

22 Claims, 6 Drawing Sheets

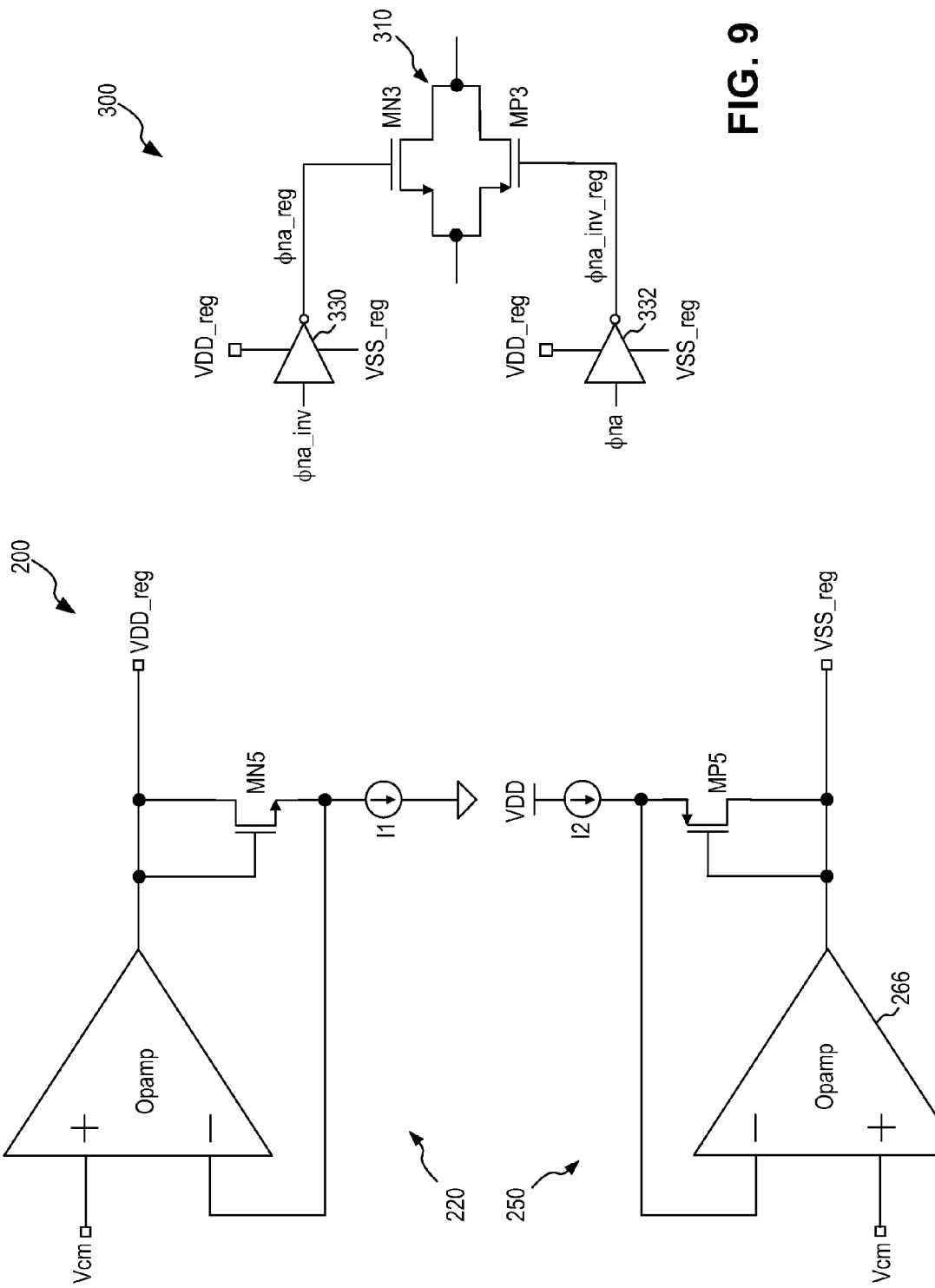

REGULATED SWITCH DRIVING SCHEME IN SWITCHED-CAPACITOR AMPLIFIERS WITH OPAMP-SHARING

FIELD OF THE INVENTION

The invention relates to switched-capacitor amplifier circuits and, in particular, to a switched-capacitor amplifier circuit with opamp-sharing implementing a regulated switch driving scheme.

DESCRIPTION OF THE RELATED ART

Switched-Capacitor (SC) amplifiers are the most important building blocks in CMOS pipelined analog-to-digital-converters (ADCs). FIG. 1 illustrates one commonly used SC amplifier referred to as a multiplying-digital-to-analog-converter (MDAC). The MDAC of FIG. 1 is often applied in a pipelined ADC for providing fast and high resolution conversions. For instance, it is known to implement a 1.5b/stage pipelined ADC using the MDAC of FIG. 1.

The MDAC of FIG. 1 operates under a non-overlapping clocking scheme as shown in FIG. 2. FIG. 3 illustrates an exemplary clock signal generator which can be used to generate the non-overlapping clock signals shown in FIG. 2. Referring to FIG. 1, SC amplifier 10 has two phase of operation: a sampling phase and an amplifying phase. During the sampling phase, clock $\phi1$ is high and the input signal Vin is sampled onto capacitors C1 and C2. During the amplifying phase, clock $\phi2$ is high and capacitor C1 is connected to a reference voltage Vr while capacitor C2 is connected to the output terminal of an amplifier 12 providing an output voltage Vout. Amplifier 12 is typically implemented as an operational amplifier (opamp). The MDAC function is thus realized and the output voltage Vout can be used to drive the next stage in a pipelined ADC.

In the two-phase operation scheme, the amplifier is reset during the sampling phase and is only being used during the amplifying phase to amplify the input signal. Based on this observation, an opamp-sharing technique which shares one opamp between two MDAC stages has been proposed to conserve power and silicon area. FIG. 4 illustrates a SC amplifier configured for MDAC function and implementing a shared opamp scheme for sampling two input signals. The two input signals VinA and VinB can be conversion signals for two successive stages. To implement opamp-sharing, the input sampling and reset circuit of FIG. 1 is duplicated so that two pairs of capacitors are provided to sample each input signal VinA and VinB. Furthermore, switches M3 and M4 are added at the input terminal to opamp 22 to connect or disconnect the capacitor pairs in different operation stages so as to realize the opamp-sharing function.

Although the opamp sharing technique shown in FIG. 4 can significantly reduce the power consumption, it brings extra design complexity to the ADC, which becomes a limiting factor in high speed and/or high resolution ADC design. Indeed, the additional switches M3 and M4 pose great challenges to the design at high ADC speed (e.g. 170 MS/s). The switches not only introduce extra series resistance that slows down the opamp settling, but also cause extra charge injection errors to the conversion, resulting in larger offset and inferior linearity. Furthermore, further performance degradation is observed with power supply variations.

Moreover, there is a speed and accuracy trade-off when choosing the switch size for switches M3 and M4. While a large switch size leads to low series resistance which is good for high speed operation, but large switch size also leads to large charge injection error which is one of the major limiting factors to ADC linearity. In practical designs, the variation of process, voltage and temperature (PVT) makes the situation much worse. When the switch size is chosen to satisfy the settling time requirement at lower power supply, high temperature and slow process, the switch size almost always appears too large at high supply, low temperature and fast process, resulting in unnecessary large charge injection. So it becomes very difficult to determine the optimal size of the switches so that both fast settling and low charge injection can be achieved over the PVT variation when the conversion rate approaches the technology limit.

BRIEF DESCRIPTION OF THE DRAWINGS

FIG. 8 is a circuit diagram illustrating a pair of complementary voltage regulators for generating a positive regulated power supply voltage and a negative regulated power supply voltage according to one embodiment of the present invention.

FIG. 9 illustrates the application of the regulated switch driving scheme of the present invention to input switches implemented using transmission gates.

DETAILED DESCRIPTION OF THE PREFERRED EMBODIMENTS

In accordance with the principles of the present invention, a switched-capacitor amplifier circuit configured in an opamp-sharing scheme implements a regulated switch driving scheme where a regulated power supply voltage is provided to drive a set of input switches coupling the sampling capacitors to an input terminal of the opamp. The regulated power supply voltage ensures that the set of input switches are driven at the optimal operating point and are isolated from power supply and process variations. By using a regulated power supply voltage to drive the set of input switches, the switched-capacitor amplifier circuit can realize effective opamp-sharing while ensuring high speed of operation and high accuracy in the conversion results.

The regulated switch driving scheme of the present invention is particularly advantageous in enabling the use of low voltage and high voltage devices to implement the switched-capacitor amplifier circuit. In one embodiment, the switched-capacitor amplifier circuit is fabricated using a dual gate oxidation (DGO) process including high voltage transistor devices and low voltage transistor devices. The set of input switches is implemented using thin gate oxide low voltage devices. The regulated switch driving scheme provides a regulated power supply voltage suitable for the low voltage devices so that the input switches are driven with an appropriate power supply voltage and long term reliability of the amplifier circuit is ensured. Meanwhile, the use of low voltage devices as the input switches enables the amplifier circuit to achieve fast settling time and minimize charge injection.

Another characteristics of the switched-capacitor amplifier circuit of the present invention is that when the input switches are driven by the regulated power supply voltage, the on-resistance of the input switches tracks the transconductance of the input differential pair of the opamp over process, power supply and temperature variations. Therefore, the performance of the switched-capacitor amplifier is optimized over process, power supply and temperature variations.

Figure 5:
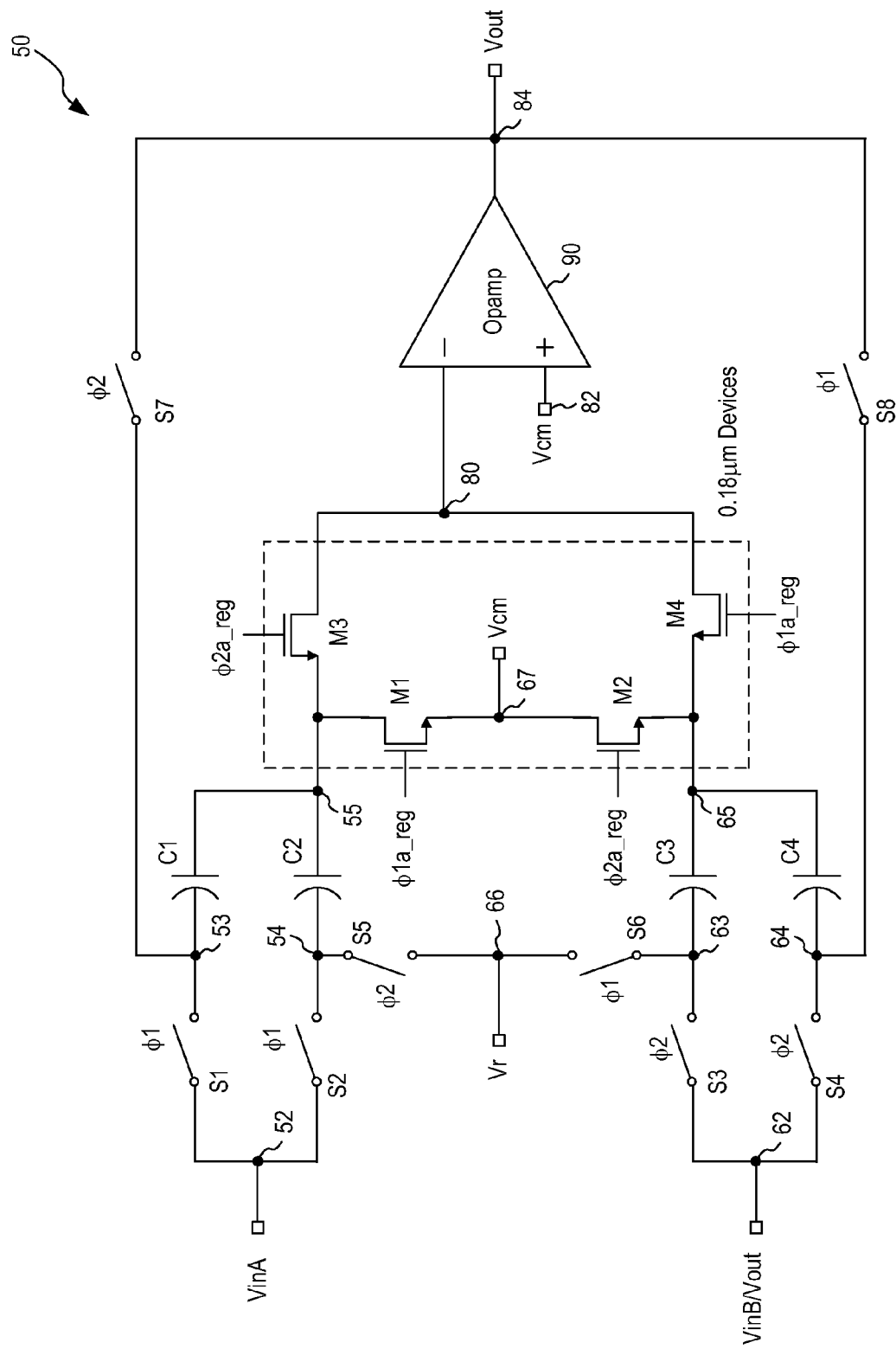
FIG. 5 is a circuit diagram of a switched-capacitor amplifier circuit with opamp sharing implementing the regulated switch driving scheme according to one embodiment of the present invention.

FIG. 5 is a circuit diagram of a switched-capacitor amplifier circuit with opamp sharing implementing the regulated switch driving scheme according to one embodiment of the present invention. Referring to FIG. 5, switched-capacitor amplifier circuit 50 (herein after "amplifier circuit" 50) is configured as a multiplying-digital-to-analog-converter (MDAC) for sampling a pair of input signals VinA and VinB and providing an output signal Vout which can be used in the next stage of a pipelined ADC. Furthermore, the opamp-sharing scheme can be implemented using the output voltage Vout as the second input signal VinB so that the same amplifier circuit is used to process the conversion signals for successive stages.

Figure 1:
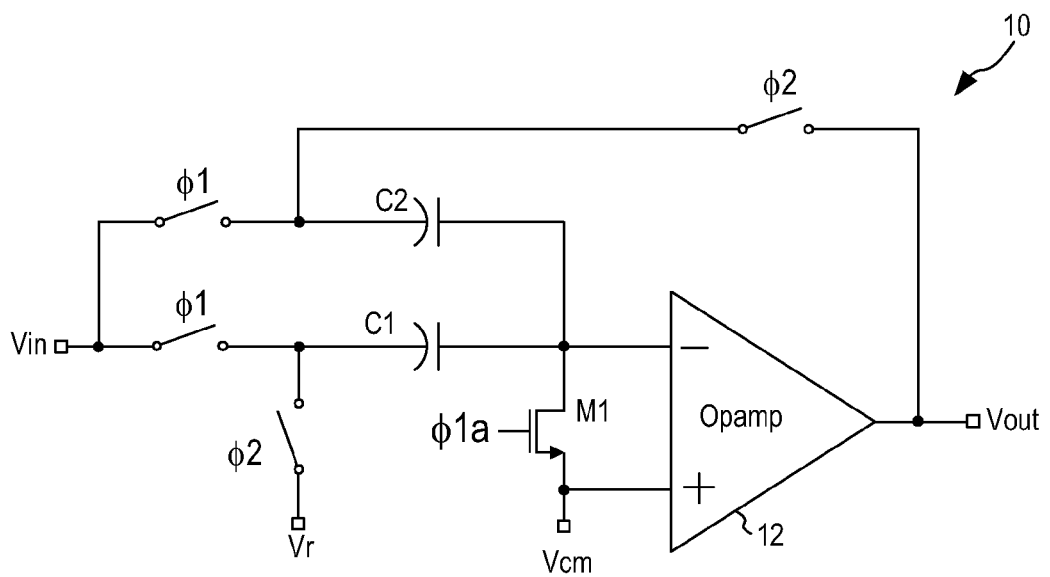
FIG. 1 illustrates one commonly used SC amplifier referred to as a multiplying-digital-to-analog-converter (MDAC).
Figure 2:
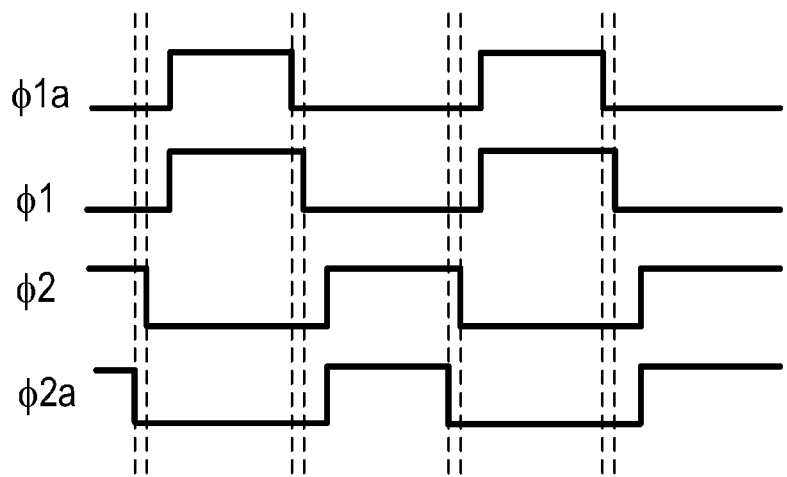
FIG. 2 is a timing diagram illustrating a non-overlapping clocking scheme which can be used to operate the SC amplifier of FIG. 1.

In the present illustration, amplifier circuit 50 is operated under the clocking scheme of FIG. 2. Referring to FIG. 2, a first clock signal $\phi 1$ and a second clock signal $\phi 2$ are generated from a master clock. Clock signals $\phi 1$ and $\phi 2$ are non-overlapping and the rising and falling edges of the two clock signals do not coincide. A first derivative clock signal $\phi 1a$ is generated based on clock signal $\phi 1$ and a second derivative clock signal $\phi 2a$ is generated based on clock signal $\phi 2$. The derivative clock signals have at least the falling edge that is non-overlapping with the associated base clock signal. That is, the falling edge of clock signal $\phi 1a$ is earlier than the falling edge of clock signal $\phi 1$, and similarly for clock signals $\phi 2a$ and $\phi 2$. The rising edges of the derivative clock signals are not as critical and may or may not be overlapping with the associated base clock signals.

However, it is instructive to note that even though the conventional clock scheme is applied to drive the amplifier circuit 50 of the present invention, one or more of the clock signals are generated in accordance with the regulated switch driving scheme of the present invention so that the clock signals generated using the regulated power supply voltage will have a different voltage magnitude than the clock signals generated using the nominal power supply voltage of the amplifier circuit 50.

In the present embodiment, switched-capacitor amplifier circuit 50 is fabricated using a dual-gate oxidation (DGO) CMOS fabrication process having thick gate oxide devices as low speed high voltage MOS transistors and thin gate oxide devices as high speed low voltage MOS transistors. The low voltage MOS transistors are typically associated with lower charge injection but cannot sustain high voltage stresses. In some applications, the switched-capacitor amplifier circuit is operated by a nominal power supply voltage that is designated for the high voltage transistors. In one embodiment, switched-capacitor amplifier circuit 50 is fabricated using a 0.18 μm dual gate oxidation CMOS process where the low voltage devices are 0.18 μm channel length thin gate oxide devices and the high voltage devices are 0.35 μm channel length thick gate oxide devices. The switched-capacitor amplifier circuit 50 uses a nominal power supply voltage of 3.3 V designated for the high voltage devices.

In accordance with the regulated switch driving scheme of the present invention, a regulated power supply voltage suitable for operating the low voltage devices is generated to enable the use of the low voltage devices in the switched-capacitor amplifier circuit. Even when the switched-capacitor amplifier circuit is operated at a nominal power supply voltage that is designated for the low voltage devices (e.g. 1.8 V), the regulated power supply voltage of the present invention provides advantages in that the regulated power supply voltage provides an overdrive voltage to ensure a higher gate-to-source voltage than that provided by the nominal power supply. Furthermore, the regulated power supply voltage is independent of process and power supply variations so that the switched-capacitor amplifier circuit is provided with more margins for optimal operation.

Amplifier circuit 50 includes a first pair of sampling capacitors C1 and C2 for sampling the first input signal VinA and a second pair of sampling capacitors C3 and C4 for sampling the second input signal VinB. A first set of switches S1 and S2, under the control of clock signal $\phi 1$, connects the input signal VinA (node 52) to the top plate of capacitors C1 and C2 (nodes 53 and 54). The bottom plates of capacitors C1 and C2 are connected together (node 55) and are switchably connected to a first reference voltage Vcm (node 67) and switchably connected to the negative input terminal (node 80) of an amplifier 90. In the present embodiment, amplifier 90 is implemented as an operational amplifier (opamp). The positive input terminal (node 82) of opamp 90 is connected to the first reference voltage Vcm which is the common mode voltage of the amplifier circuit 50. More specifically, a switch M1 connects the bottom plates (node 55) of capacitors C1 and C2 to the reference voltage Vcm (node 67) while a switch M3 connects the bottom plates (node 55) of capacitors C1 and C2 to the negative input terminal (node 80) of opamp 90.

The same construction applies to the second input signal. A second set of switches S3 and S4, under the control of clock signal $\phi 2$, connects the input signal VinB (node 62) to the top plate of capacitors C3 and C4 (nodes 63 and 64). The bottom plates of capacitors C3 and C4 are connected together (node 65) and are switchably connected to the common mode voltage Vcm (node 67) and switchably connected to the negative input terminal (node 80) of opamp 90. More specifically, a switch M2 connects the bottom plates (node 65) of capacitors C3 and C4 to the common mode voltage Vcm (node 67) while a switch M4 connects the bottom plates (node 65) of capacitors C3 and C4 to the negative input terminal (node 80) of opamp 90.

In amplifier circuit 50, switches M1 to M4 are controlled by regulated clock signals $\phi 1a\_reg$ and $\phi 2a\_reg$ having the same timing characteristics as clock signals $\phi 1a$ and $\phi 2a$ in FIG. 2. However, regulated clock signals $\phi 1a\_reg$ and $\phi 2a\_reg$ are generated under the regulated switch driving scheme of the present invention and are referenced to a regulated power supply voltage, as will be described in more detail below. Thus, regulated clock signals $\phi 1a\_reg$ and $\phi 2a\_reg$ may have a voltage magnitude different from clock signals $\phi 1$ and $\phi 2$. Alternately, the regulated clock signals φ1a_reg and φ2a_reg may provide an overdrive voltage for biasing switches M1 to M4 to a desired operating point.

In the present description, the capacitor is described as having a top plate and a bottom plate. The use of the term "top" and "bottom" to describe the two conductive plates of a capacitor is illustrative only and does not refer to any specific directional requirement for the capacitor. It is well understood that a capacitor is formed by two conductors separated by a dielectric in between. The two plates of the capacitor are interchangeable and each can be the top or bottom plate of the capacitor.

Amplifier circuit 50 further includes switches S5 and S6 for resetting the sampling capacitors during the amplifying phase of operation and switches S7 and S8 for connecting the output voltage Vout (node 84) of opamp 90 to the sampling capacitor to complete the feedback loop of the amplifier circuit. Specifically, switch S5, under the control of clock signal φ2, connects the top plate (node 54) of capacitor C2 to a second reference voltage Vr (node 66) while switch S6, under the control of clock signal φ1, connects the top plate (node 63) of capacitor C3 to the second reference voltage Vr (node 66). Switch S7, under the control of clock signal φ2, connects the output voltage Vout (node 84) of opamp 90 to the top plate (node 53) of capacitor C1. Switch S8, under the control of clock signal φ1, connects the output voltage Vout (node 84) of opamp 90 to the top plate (node 63) of capacitor C3.

In amplifier circuit 50, switches S1 to S8 can be implemented as single transistor switches (PMOS or NOMS transistors) or as a transmission gate including a PMOS transistor and an NMOS transistor connected in parallel. Similarly, switches M1 to M4 can be implemented as single transistor switches (PMOS or NOMS transistors) or as transmission gates. It is well understood by one of ordinary skill in the art that the polarities of the clock signals driving the switches may have to be changed if PMOS transistors are used in place of NMOS transistors. Also, when transmission gates are used, complementary clock signals are required to drive each transmission gate, as is well known in the art.

In the present embodiment, switches S1 to S8 are configured so that they are open when the applied clock signal is at a logical low level and are closed when the applied clock signal is at a logical high level. Furthermore, switches S1 to S8 are implemented using high voltage transistor devices of the DGO fabrication process, such as the 0.35 μm channel length thick gate oxide devices.

In the present embodiment, switches M1 to M4 are implemented using NMOS transistors and are configured so that they are open when the applied clock signal is at a logical low level and are closed when the applied clock signal is at a logical high level. Furthermore, switches M1 and M4 are implemented using low voltage transistor devices of the DGO fabrication process, such as the 0.18 μm channel length thin gate oxide devices. The low voltage transistors operate at a much higher speed than the high voltage devices and have lower charge injection levels. In one embodiment, the low voltage devices have about three times the unity-gain frequency ($f_T$) as the high voltage devices.

In accordance with the regulated switch driving scheme of the present invention, NMOS transistors M1 to M4, being low voltage devices, are driven by clock signals φ1a_reg and φ2a_reg that are referenced from a regulated power supply voltage. The regulated power supply voltage having a voltage magnitude suitable for the low voltage devices to ensure that the low voltage devices are not exposed to undesirable voltage stresses. For instance, when amplifier circuit 50 is fabricated using the 0.18 μm DGO CMOS fabrication process, the nominal power supply voltage is 3.3 volts. To ensure long term reliability, the voltage stress applied to the low voltage transistors M1 to M4 needs to be less than 1.8 volts.

Figure 3:
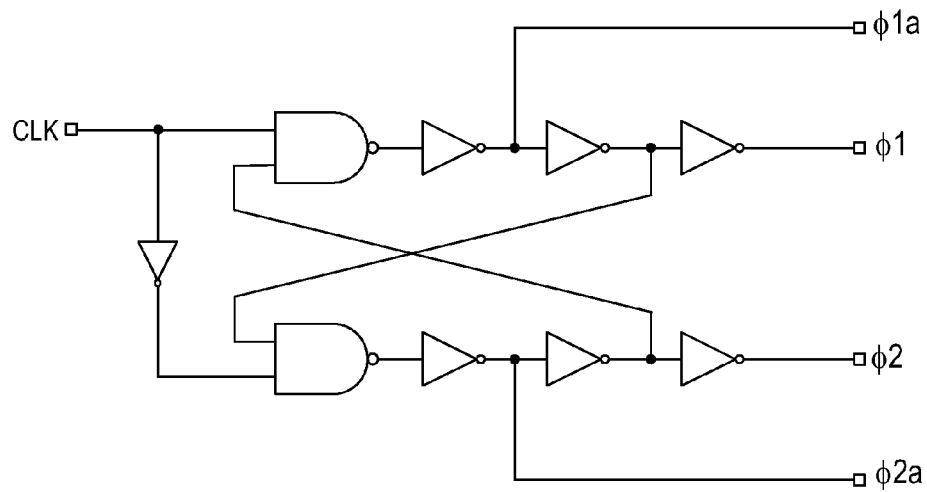
FIG. 3 illustrates an exemplary clock signal generator which can be used to generate the non-overlapping clock signals shown in FIG. 2.
Figure 6:
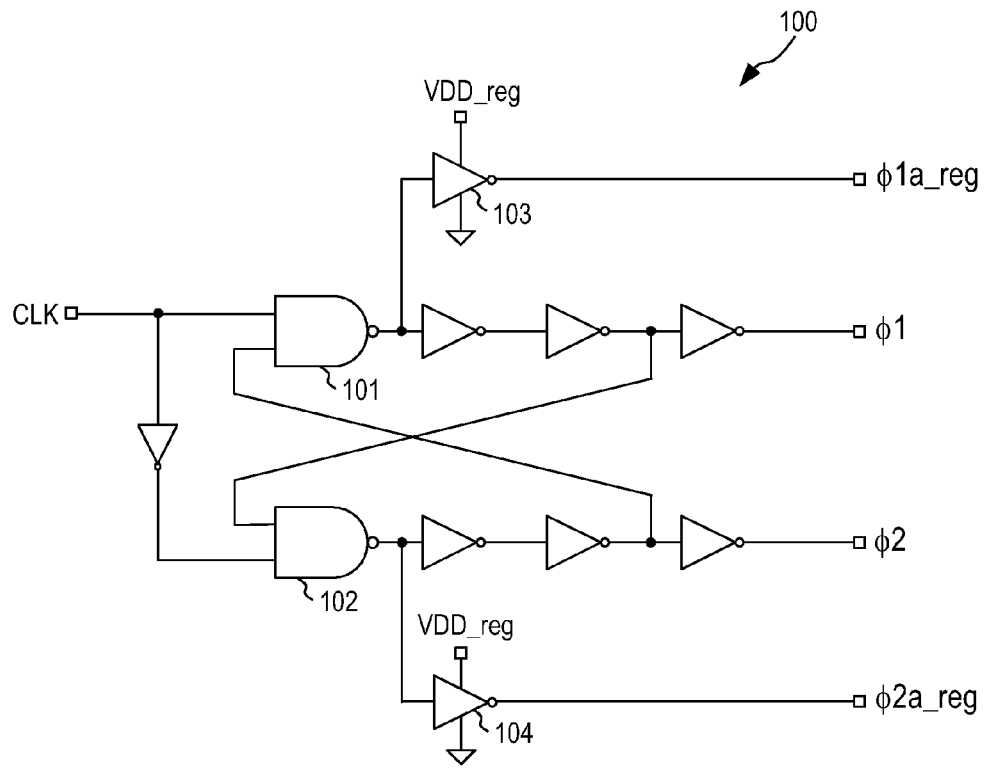
FIG. 6 is a circuit diagram of a clock signal generator implementing the regulated switch driving scheme according to one embodiment of the present invention.
Figure 4:
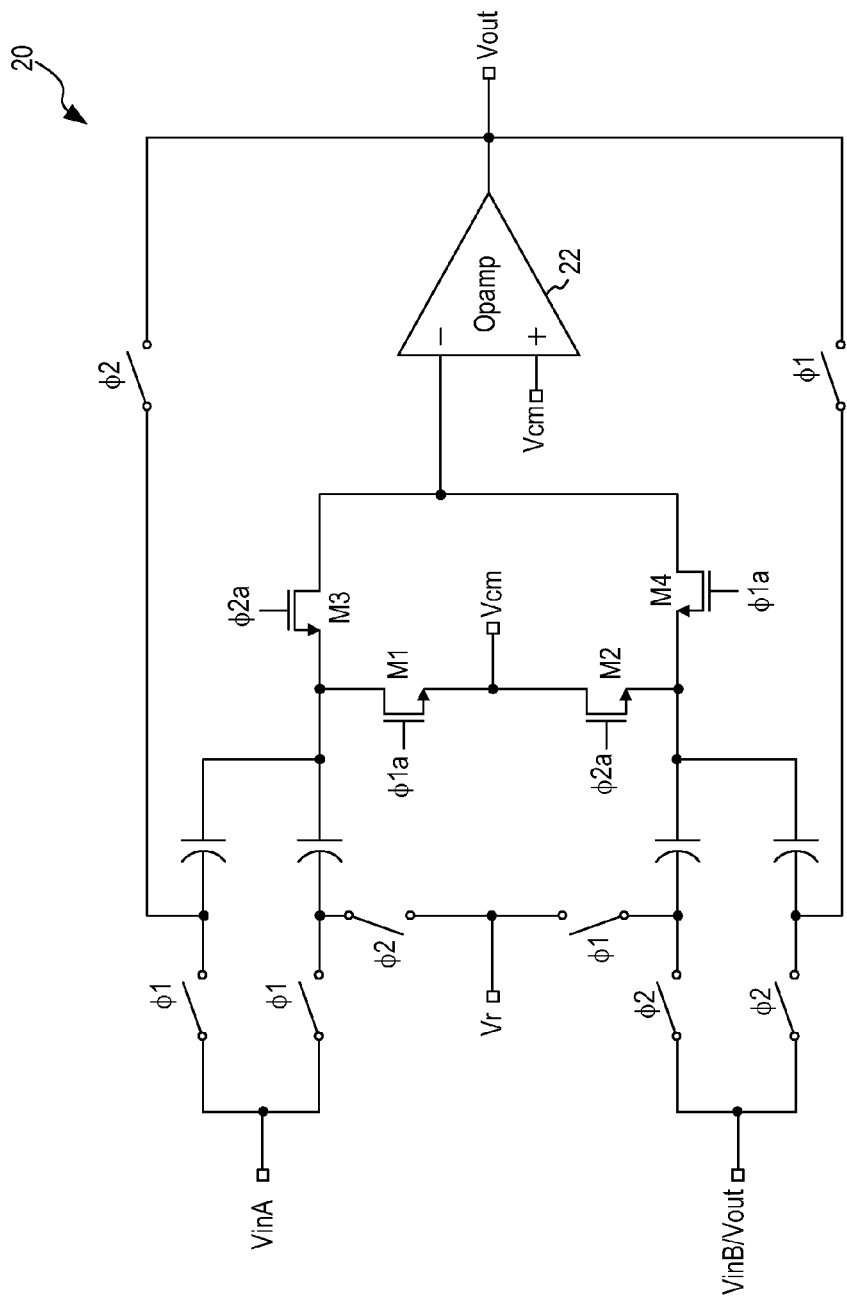
FIG. 4 illustrates a SC amplifier configured for MDAC function and implementing a shared opamp scheme for sampling two input signals.

In accordance with the regulated switch driving scheme of the present invention, amplifier circuit 50 includes a voltage regulator (not shown in FIG. 5) to generate the regulated power supply voltage VDD_reg which is used to generate the regulated clock signals φ1a_reg and φ2a_reg. FIG. 6 is a circuit diagram of a clock signal generator implementing the regulated switch driving scheme according to one embodiment of the present invention. The clock signal generator 100 of FIG. 6 is constructed in a similar manner as the clock signal generator of FIG. 3. However, additional drivers referenced to the regulated power supply voltage are provided to generate the regulated clock signals φ1a_reg and +2a_reg.

Referring to FIG. 6, a pair of cross-coupled NAND gates 101, 102 receive the master clock signal CLK and its inverse and generate the non-overlapping clock signals φ1 and φ2 through a pair of inverter chains. Clock signal generator 100 includes a first inverting buffer (or an inverter) 103 and a second inverting buffer 104 both powered by the regulated power supply voltage VDD_reg. The other logic gates (NAND gates and inverters) in clock signal generator 100 are powered from the nominal power supply VDD. First inverting buffer 103 is coupled to the output terminal of NAND gate 101 and generates the regulated clock signal φ1a_reg referenced to the regulated power supply voltage VDD_reg. Second inverting buffer 104 is coupled to the output terminal of NAND gate 102 and generates the regulated clock signal φ2a_reg referenced to the regulated power supply voltage VDD_reg. Clock signals φ1 and φ2 generated by the inverting chains are referenced to the nominal power supply voltage VDD. In one embodiment, the regulated power supply voltage VDD_reg is 1.8 V while the nominal power supply voltage is 3.3 V.

In FIG. 6, regulated clock signals φ1a_reg and φ2a_reg are generated from inverting buffers. One of ordinary skill in the art would appreciate that the polarity of the buffers for generating the regulated clock signals φ1a_reg and φ2a_reg is not critical to the practice of the present invention and the polarity of buffers 103, 104 is selected based on the logical construction of the clock signal generator circuit. In other embodiments, an inverting or a non-inverting buffer, referenced to the regulated power supply voltage, can be used to generate the regulated clock signals. The regulated switch driving scheme of the present invention requires only that the last clock signal buffer for generating the regulated clock signals be referenced to the regulated power supply voltage.

In accordance with the regulated switch driving scheme of the present invention, a voltage regulator is used to generate the regulated power supply voltage VDD_reg. The voltage regulator provides a regulated power supply voltage that is independent of the power supply variations and actually operates to counteract the power supply and process variations. By using the regulated power supply voltage to drive switches M1 to M4, the switches can be designed to have an optimal size suitable over process and power supply variations.

In operation, if the fabrication process is slow, then the regulated power supply voltage is driven higher to satisfy the speed requirement for the switched-capacitor amplifier circuit. If the fabrication process is fast, the regulated power supply voltage is driven lower as the speed of the amplifier circuit is already fast and the impedance is already low. By driving the switches at a lower power supply voltage, less charge injection results.

Figure 7:
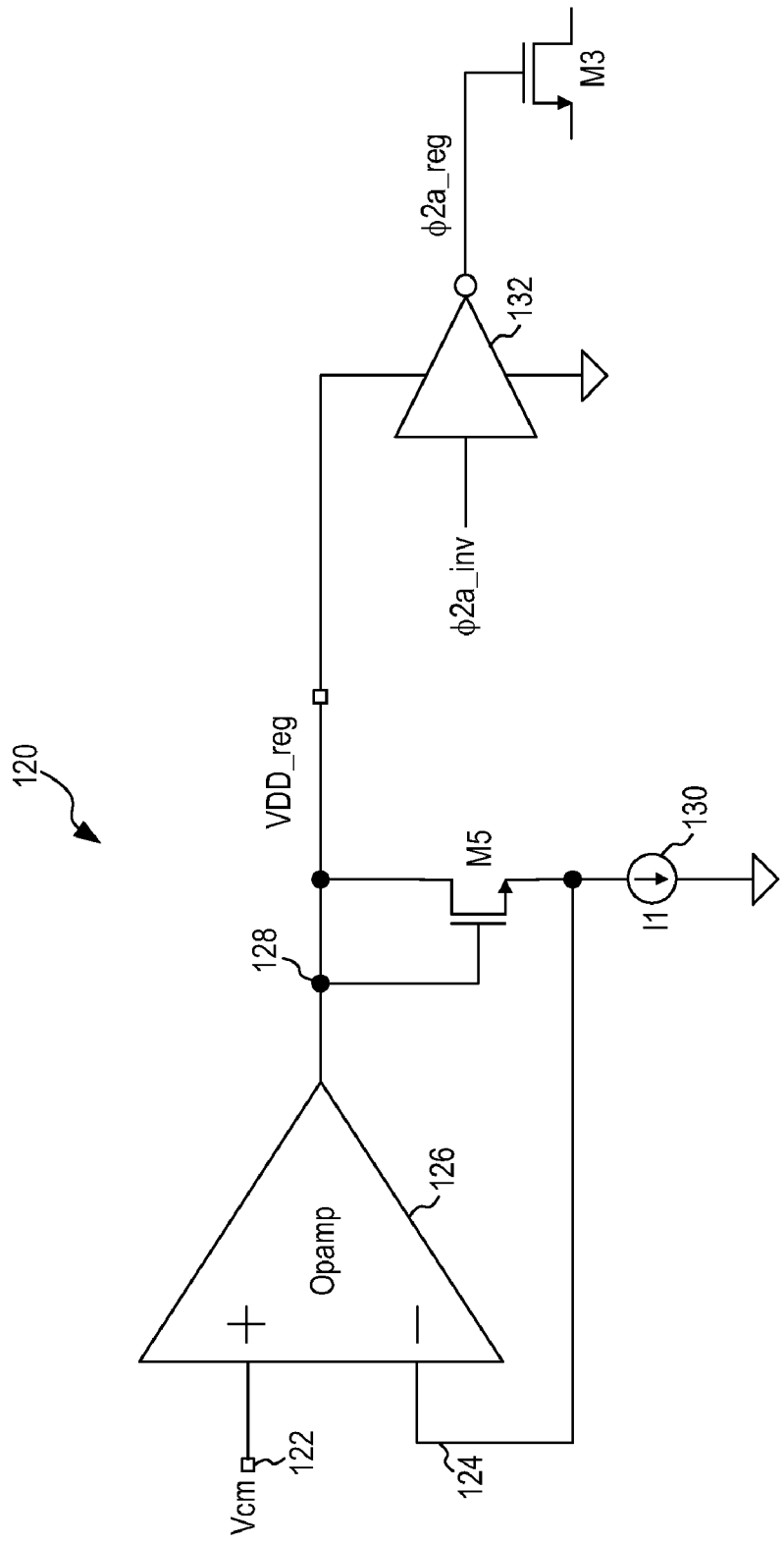
FIG. 7 is a circuit diagram of a voltage regulator for generating a regulated power supply voltage for driving a clock signal buffer according to one embodiment of the present invention.

FIG. 7 is a circuit diagram of a voltage regulator for generating a regulated power supply voltage for driving a clock signal buffer according to one embodiment of the present invention. Referring to FIG. 7, a voltage regulator 120 includes an amplifier 126 which is implemented as an operational amplifier. The positive input terminal 122 of amplifier 126 receives the common mode voltage Vcm and the negative input terminal 124 is configured in a feedback loop configuration. In the present embodiment, an NMOS transistor M5 is coupled to the output terminal 128 of opamp 126. Specifically, the gate and drain terminals of transistor M5 are both connected to the output terminal 128 of opamp 126 while the source terminal of transistor M5 is connected to the negative input terminal 124 of opamp 126 to complete the feedback loop. The source terminal of transistor M5 is also connected to a current source 130 providing a current I1.

In the present embodiment, transistor M5 is implemented as a low voltage NMOS transistor. As such, transistor M5 emulates the operating conditions of NMOS transistors M1 to M4 to allow the voltage regulator 120 to be responsive to process variations that may affect transistors M1 to M4. Opamp 126 can be implemented using high voltage devices as the opamp provides amplification functions only and operates only to maintain the regulated output voltage.

Opamp 126, as thus configured, provides a regulated output voltage on output terminal 128 as the regulated power supply voltage VDD_reg. The regulated power supply voltage VDD_reg has a voltage value equals to the Vcm voltage plus the drain-to-source voltage across transistor M5. That is:

$$VDD\_reg = Vcm + V_{SD\_M5}.$$

The regulated power supply voltage VDD_reg is thus independent of the nominal power supply voltage VDD and is thus isolated from any supply voltage variations that may appear on the power supply voltage VDD.

To illustrate the regulated switch driving scheme of the present invention in entirety, the regulated power supply voltage VDD_reg provided by voltage regulator 120 in FIG. 7 is shown as being coupled to supply a clock signal buffer 132. Clock signal buffer 132 is representative of buffers 103 and 104 in clock signal generator 100 of FIG. 6. Buffer 132 receives a clock signal φ2a_inv and provides the regulated clock signal φ2a_reg which is coupled to drive transistor M3 of the switched-capacitor amplifier circuit 50 (FIG. 5) in the present illustration. Of course, in actual implementation, the regulated power supply voltage VDD_reg is coupled to drive both buffers 103 and 104 (FIG. 6) in the clock signal generator so that a pair of regulated clock signals φ1a_reg and φ2a_reg are generated to drive the low voltage switches M1 to M4 in the switched-capacitor amplifier circuit 50 (FIG. 5).

The regulated switch driving scheme of the present invention using a regulated power supply voltage to generate regulated clock signals for the switched-capacitor amplifier circuit provides many advantages. First, the regulated power supply voltage VDD_reg is the opamp input common mode voltage Vcm plus the voltage across a diode-connected NMOS transistor M5. Therefore the net switch overdrive voltage for any one of transistors M3 and M4 is just the source-to-drain voltage across transistor M5 which is completely independent of the power supply voltage VDD of the amplifier circuit.

Second, the regulated power supply voltage can ensure that the on-resistance of switches M3 and M4 tracks inversely with the amplifier (opamp 90) transconductance. Specifically, the on-resistance of transistor M3 (or transistor M4) can be written as:

$$Ron = \frac{1}{\left(k \cdot \frac{W3}{L3} \cdot (V_{gs} - V_t)\right)}, \quad \text{Eq. (1)}$$

where W3 and L3 are the channel width and channel length of transistor M3 respectively. Voltage $V_{gs}$ is the gate to source/drain overdrive voltage of transistor M3 and is equal to the gate-to-source voltage of transistor M5. Voltage $V_t$ is the threshold voltage of transistors M3 and M5 and k is the process related constant.

The transconductance of transistor M5 can be written as:

$$g_m = k \cdot \frac{W5}{L5} \cdot (V_{gs} - V_t), \quad \text{Eq. (2)}$$

where W5 and L5 are the channel width and channel length of transistor M5 respectively.

Eq. (2) can be used to solve for the term $(V_{gs}-V_t)$ in Eq. (1). Assuming that L3=L5, an equation for the on-resistance of transistor M3 can be expressed as:

$$Ron = \frac{W5}{g_m \cdot W3}, \quad \text{Eq. (3)}$$

As can be observed from Eq. (3), the on-resistance Ron is a function of the size ratio of transistor M3 and M5. Thus, on-resistance Ron of transistor M3 is insensitive to process variations. Furthermore, on-resistance Ron is inversely proportional to $g_m$—the transconductance of transistor M5. The transconductance of M5 is related to the transconductance of the input differential pair of opamp 90 of the switched-capacitor amplifier circuit 50.

Thus, the bias current I1 for transistor M5 can be set so that the transconductance of transistor M5 tracks the transconductance of the input differential pair of opamp 90. Accordingly, the on-resistance of switches M3 and M4 will track the variations in the transconductance of the input differential pair of opamp 90 over process, power supply and operating temperature variations. These characteristics make it easier to optimize the settling behavior of the opamp 90.

In one embodiment, current I1 is a mirrored copy of a master bias current of the switched-capacitor amplifier circuit 50 of FIG. 5. The master bias current is used to provide bias currents for opamp 90 as well as the bias current I1. Thus, current I1 is a ratioed current of the bias current for opamp 90. When process, power supply or temperature variations cause changes in the bias current for opamp 90, current I1 will change accordingly so that the process, power supply and temperature variations are canceled out.

Third, in the above description, the regulated power supply voltage is limited to a value suitable for the low voltage devices, such as 1.8 V. However, it is not necessary to limit the regulated power supply voltage to under 1.8 V or the power supply voltage designated for the low voltage devices. In some cases, a slightly larger switch overdrive voltage is preferred for lower on-resistance. In that case, the regulated power supply voltage can exceed 1.8 V as long as the gate to source/drain voltage of the low voltage transistors is less than 1.8 V, as often applied in the well-known bootstrapped switch techniques.

Fourth, the switches M3 and M4 at the opamp input are the most sensitive to the power supply noise. Therefore, by separating the power supply voltage of the drivers for switches M3 and M4 from other switch drivers and clocking circuitry, there will be lower digital noise coupling to switches M3 and M4 and their driver which is critical in an ultra-high speed design.

Finally, the use of low voltage transistors for input switches combined with the regulated switch driving scheme of the present invention offers significant speed advantage and design freedom, and also eliminates the performance limit of the extra resistance due to switches M3 and M4 added for opamp sharing. The performance improvement can be observed even for ADC operating at 170 MS/s.

The regulated switch driving scheme of the present invention can also be applied in other ADC topology, such as a time-interleaved ADC or programmable-gain-amplifier (PGA), which shares opamps between multiple channels for low cross-talk and good linearity. Even in a SC amplifier circuit without opamp sharing, the regulated switch driving scheme of the present invention can be applied to achieve low digital coupling noise and low charge injection error.

In the above descriptions, switches M1 to M4 are implemented as low voltage NMOS transistors. Thus, only a positive regulated power supply voltage VDD_reg is required to implement the regulated switch driving scheme. In other embodiments, switches M1 to M4 may be implemented as PMOS transistors or as transmission gates. When switches M1 to M4 are implemented using PMOS transistors, the regulated switch driving scheme of the present invention can be configured to provide a negative regulated power supply voltage for driving the PMOS transistors.

When switches M1 to M4 are implemented as transmission gates including a pair of parallelly connected NMOS and PMOS transistors, a complementary version of the regulated switch driving scheme described above can be provided to provide complementary regulated power supply voltages. FIG. 8 is a circuit diagram illustrating a pair of complementary voltage regulators for generating a positive regulated power supply voltage and a negative regulated power supply voltage according to one embodiment of the present invention. Referring to FIG. 8, a voltage regulator system 200 includes a first voltage regulator 220 providing a positive regulated power supply voltage VDD_reg from the input common mode voltage Vcm. The construction of voltage regulator 220 of FIG. 8 is the same as voltage regulator 120 of FIG. 7.

Voltage regulator system 200 also includes a second voltage regulator 250 for providing a negative regulated power supply voltage VSS_reg. Voltage regulator 250 includes an amplifier (opamp) 266 receiving the input common mode voltage Vcm on its positive input terminal. A PMOS transistor MP5 has its gate and drain terminal coupled to the output terminal of opamp 266. The source terminal of transistor MP5 is coupled to the negative input terminal of opamp 266 and also coupled to receive a bias current I2. A negative regulated power supply voltage VSS_reg is thus generated on the output terminal of opamp 266. The negative regulated power supply voltage VSS_reg has a voltage value equals to the Vcm voltage minus the drain-to-source voltage across transistor MP5. That is:

$$VSS\_reg = Vcm - V_{SD\_MP5}.$$

The negative regulated power supply voltage VSS_reg has a voltage value close to the ground potential when the common mode voltage Vcm is about VDD/2. When the common mode voltage Vcm is near the VDD voltage, the negative regulated power supply voltage can be higher than the ground voltage.

FIG. 9 illustrates the application of the regulated switch driving scheme of the present invention to input switches implemented using transmission gates. Referring to FIG. 9, a pair of parallelly connected NMOS transistor MN3 and PMOS transistor MP3 form a transmission gate 310. Transmission gate 310 is representative of any one of switches M1 to M4 in the switched-capacitor amplifier circuit of FIG. 5. The positive and negative regulated power supply voltages are coupled to drive a pair of clock signal drivers 330 and 332. Clock signal driver 330 is coupled to drive the NMOS transistor MN3 while clock signal driver 332 is coupled to drive the PMOS transistor MP3. Clock signal drivers 330 and 332 receive input clock signals of opposite polarities (φna and φna_inv) and generate regulated clock signals of opposite polarities (φna_reg and φna_inv_reg) for driving transmission gate 310. The regulated clock signals φna_reg and φna_inv_reg are referenced to the positive and negative regulated power supply voltages VDD_reg and VSS_reg.

The use of transmission gates for switches M1 to M4 provides certain advantages. When complementary transistors are used for the switches, smaller voltage swing in the clock signals can be used which results in shorter rise/fall time and smaller clock feedthrough due to parasitic. These characteristics are very desirable for high speed ADC design.

The above detailed descriptions are provided to illustrate specific embodiments of the present invention and are not intended to be limiting. Numerous modifications and variations within the scope of the present invention are possible. The present invention is defined by the appended claims.

We claim:

1. A switched-capacitor amplifier circuit for sampling a pair of input signals, the switched-capacitor amplifier circuit comprising first and second pairs of sampling capacitors, each pair of sampling capacitors coupled to sample a respective input signal and transfer charge associated with the sampled input signal to a first input terminal of an amplifier where a second input terminal of the amplifier is coupled to a first reference voltage, the switched-capacitor amplifier circuit being fabricated in a dual gate oxide fabrication process having thick gate oxide devices as high voltage MOS transistors and thin gate oxide devices as low voltage MOS transistors, the switched-capacitor amplifier circuit further comprising:

a voltage regulator coupled to receive the first reference voltage and generate a first regulated output voltage related to the first reference voltage and independent of a first power supply voltage of the switched-capacitor amplifier circuit;

a clock signal generator receiving a master clock signal and generating a first clock signal and a second clock signal based on the master clock signal and referenced to the first power supply voltage, the first and second clock signals having opposite phase and being non-overlapping and being used to control the input signal sampling and charge transfer operations of the first and second pairs of sampling capacitors, the clock signal generator further generating a third clock signal related to the first clock signal and a fourth clock signal related to the second clock signal, the third and fourth clock signals being referenced to the first regulated output voltage;

a first switch coupled between the bottom plates of the first pair of sampling capacitors and the first reference voltage, the first switch being controlled by the third clock signal;

a second switch coupled between the bottom plates of the second pair of sampling capacitors and the first reference voltage, the second switch being controlled by the fourth clock signal;

a third switch coupled between the bottom plates of the first pair of sampling capacitors and the first input terminal of the amplifier, the third switch being controlled by the fourth clock signal; and a fourth switch coupled between the bottom plates of the second pair of sampling capacitors and the first input terminal of the amplifier, the fourth switch being controlled by the third clock signal, wherein each of the first, second, third and fourth switches is implemented using one or more low voltage MOS transistors and the first regulated output voltage has a voltage value suitable for operating the low voltage MOS transistors.

2. The switched-capacitor amplifier circuit of claim 1, wherein the first power supply voltage has a voltage value designated for operating the high voltage MOS transistors and the first regulated output voltage for operating the low voltage MOS transistors has a substantially constant voltage magnitude and a voltage value less than the first power supply voltage.

3. The switched-capacitor amplifier circuit of claim 2, wherein the dual gate oxide fabrication process includes 0.35 µm thick gate oxide MOS transistors as the high voltage MOS transistors and 0.18 µm thin gate oxide MOS transistors as the low voltage MOS transistors, the first power supply voltage has a voltage value of 3.3 volts, the first regulated output voltage has a value of 1.8 volts.

4. The switched-capacitor amplifier circuit of claim 1, wherein the amplifier comprises an operational amplifier (opamp).

5. The switched-capacitor amplifier circuit of claim 1, wherein the switched-capacitor capacitor is configured as a multiplying-digital-to-analog-converter and further comprises:

a first pair of sampling switches coupled between a first input signal and the respective top plates of the first pair of sampling capacitors, the first pair of sampling switches being controlled by the first clock signal;

a second pair of sampling switches coupled between a second input signal and the respective top plates of the second pair of sampling capacitors, the second pair of sampling switches being controlled by the second clock signal;

a fifth switch coupled between the top plate of one sampling capacitor in the first pair of sampling capacitors and a second reference voltage, the fifth switch being controlled by the second clock signal;

a sixth switch coupled between the top plate of one sampling capacitor in the second pair of sampling capacitors and the second reference voltage, the sixth switch being controlled by the first clock signal;

a seventh switch coupled between an output terminal of the amplifier and the top plate of the other sampling capacitor in the first pair of sampling capacitors, the seventh switch being controlled by the second clock signal; and an eighth switch coupled between an output terminal of the amplifier and the top plate of the other sampling capacitor in the second pair of sampling capacitors, the seventh switch being controlled by the first clock signal.

6. The switched-capacitor amplifier circuit of claim 1, wherein the clock signal generator comprises a first driver circuit for receiving a signal indicative of the first clock signal and for generating the third clock signal, and a second driver circuit for receiving a signal indicative of the second clock signal and for generating the fourth clock signal, the first and second driver circuits being coupled to the first regulated output voltage as the power supply voltage.

7. The switched-capacitor amplifier circuit of claim 1, wherein the first, second, third and fourth switches each comprises a low voltage N-channel MOS transistor.

8. The switched-capacitor amplifier circuit of claim 7, wherein the first power supply voltage comprises a positive power supply voltage and the first regulated output voltage comprises a positive regulated power supply voltage.

9. The switched-capacitor amplifier circuit of claim 1, wherein the first, second, third and fourth switches each comprises a transmission gate including a low voltage N-channel MOS transistor and a low voltage P-channel MOS transistor connected in parallel, each transmission gate being controlled by a clock signal and its inverse.

10. The switched-capacitor amplifier circuit of claim 9, wherein the voltage regulator further generates a second regulated output voltage based on the first reference voltage and independent of the first power supply voltage, wherein the first power supply voltage comprises a positive power supply voltage, the first regulated output voltage comprises a positive regulated power supply voltage and the second regulated output voltage comprises a negative regulated power supply voltage.

11. The switched-capacitor amplifier circuit of claim 10, wherein the clock signal generator generates the third clock signal and its inverse and the fourth clock signal and its inverse being referenced to the first and second regulated output voltages, the third clock signal and its inverse and the fourth clock signal and its inverse being used to drive the respective transmission gates of the first, second, third and fourth switches.

12. The switched-capacitor amplifier circuit of claim 1, wherein the voltage regulator comprises:

a second amplifier having a positive input terminal coupled to receive the first reference voltage, a negative input terminal, and an output terminal;

a first NMOS transistor having a first current handling terminal and a control terminal coupled to the output terminal of the second amplifier, a second current handling terminal coupled to the negative input terminal of the second amplifier and to a current source providing a first current, the first NMOS transistor being a low voltage MOS transistor, wherein the first regulated voltage is provided at the output terminal of the second amplifier having a voltage value indicative of the sum of the first reference voltage and the drain-to-source voltage of the first NMOS transistor.

13. The switched-capacitor amplifier circuit of claim 10, wherein the voltage regulator comprises:

a second amplifier having a positive input terminal coupled to receive the first reference voltage, a negative input terminal, and an output terminal;

a first NMOS transistor having a first current handling terminal and a control terminal coupled to the output terminal of the second amplifier, a second current handling terminal coupled to the negative input terminal of the second amplifier and to a first current source providing a first current, the first NMOS transistor being a low voltage MOS transistor;

a third amplifier having a positive input terminal coupled to receive the first reference voltage, a negative input terminal, and an output terminal;

a first PMOS transistor having a first current handling terminal and a control terminal coupled to the output terminal of the third amplifier, a second current handling terminal coupled to the negative input terminal of the third amplifier and to a second current source providing a second current, the first PMOS transistor being a low voltage MOS transistor, wherein the first regulated voltage is provided at the output terminal of the second amplifier and has a voltage value indicative of the sum of the first reference voltage and the drain-to-source voltage of the first NMOS transistor, and the second regulated voltage is provided at the output terminal of the third amplifier and has a voltage value indicative of the difference between the first reference voltage and the drain-to-source voltage of the first PMOS transistor.

14. A switched-capacitor amplifier circuit for sampling a pair of input signals, the switched-capacitor amplifier circuit comprising first and second pairs of sampling capacitors, each pair of sampling capacitors coupled to sample a respective input signal and transfer charge associated with the sampled input signal to a first input terminal of an amplifier where a second input terminal of the amplifier is coupled to a first reference voltage, the switched-capacitor amplifier circuit further comprising:

a voltage regulator coupled to receive the first reference voltage and generate a first regulated output voltage related to the first reference voltage and independent of a first power supply voltage of the switched-capacitor amplifier circuit;

a clock signal generator receiving a master clock signal and generating a first clock signal and a second clock signal based on the master clock signal and referenced to the first power supply voltage, the first and second clock signals having opposite phase and being non-overlapping and being used to control the input signal sampling and charge transfer operations of the first and second pairs of sampling capacitors, the clock signal generator further generating a third clock signal related to the first clock signal and a fourth clock signal related to the second clock signal, the third and fourth clock signals being referenced to the first regulated output voltage;

a first switch coupled between the bottom plates of the first pair of sampling capacitors and the first reference voltage, the first switch being controlled by the third clock signal;

a second switch coupled between the bottom plates of the second pair of sampling capacitors and the first reference voltage, the second switch being controlled by the fourth clock signal;

a third switch coupled between the bottom plates of the first pair of sampling capacitors and the first input terminal of the amplifier, the third switch being controlled by the fourth clock signal; and a fourth switch coupled between the bottom plates of the second pair of sampling capacitors and the first input terminal of the amplifier, the fourth switch being controlled by the third clock signal.

15. The switched-capacitor amplifier circuit of claim 14, wherein the first regulated output voltage has a substantially constant voltage magnitude and a voltage value equal to or greater than the first power supply voltage.

16. The switched-capacitor amplifier circuit of claim 14, wherein the switched-capacitor capacitor is configured as a multiplying-digital-to-analog-converter and further comprises:

a first pair of sampling switches coupled between a first input signal and the respective top plates of the first pair of sampling capacitors, the first pair of sampling switches being controlled by the first clock signal;

a second pair of sampling switches coupled between a second input signal and the respective top plates of the second pair of sampling capacitors, the second pair of sampling switches being controlled by the second clock signal;

a fifth switch coupled between the top plate of one sampling capacitor in the first pair of sampling capacitors and a second reference voltage, the fifth switch being controlled by the second clock signal;

a sixth switch coupled between the top plate of one sampling capacitor in the second pair of sampling capacitors and the second reference voltage, the sixth switch being controlled by the first clock signal;

a seventh switch coupled between an output terminal of the amplifier and the top plate of the other sampling capacitor in the first pair of sampling capacitors, the seventh switch being controlled by the second clock signal; and an eighth switch coupled between an output terminal of the amplifier and the top plate of the other sampling capacitor in the second pair of sampling capacitors, the seventh switch being controlled by the first clock signal.

17. The switched-capacitor amplifier circuit of claim 14, wherein the clock signal generator comprises a first driver circuit for receiving a signal indicative of the first clock signal and for generating the third clock signal, and a second driver circuit for receiving a signal indicative of the second clock signal and for generating the fourth clock signal, the first and second driver circuits being coupled to the first regulated output voltage as the power supply voltage.

18. The switched-capacitor amplifier circuit of claim 14, wherein the first, second, third and fourth switches each comprises an N-channel MOS transistor.

19. The switched-capacitor amplifier circuit of claim 18, wherein the first power supply voltage comprises a positive power supply voltage and the first regulated output voltage comprises a positive regulated power supply voltage.

20. The switched-capacitor amplifier circuit of claim 14, wherein the first, second, third and fourth switches each comprises a transmission gate including an N-channel MOS transistor and a P-channel MOS transistor connected in parallel, each transmission gate being controlled by a clock signal and its inverse.

21. The switched-capacitor amplifier circuit of claim 20, wherein the voltage regulator further generates a second regulated output voltage based on the first reference voltage and independent of the first power supply voltage, wherein the first power supply voltage comprises a positive power supply voltage, the first regulated output voltage comprises a positive regulated power supply voltage and the second regulated output voltage comprises a negative regulated power supply voltage.

22. The switched-capacitor amplifier circuit of claim 21, wherein the clock signal generator generates the third clock signal and its inverse and the fourth clock signal and its inverse being referenced to the first and second regulated output voltages, the third clock signal and its inverse and the fourth clock signal and its inverse being used to drive the respective transmission gates of the first, second, third and fourth switches.

* * * * *